United States Patent
Fastow et al.

(10) Patent No.: US 6,819,615 B1
(45) Date of Patent: Nov. 16, 2004

(54) MEMORY DEVICE HAVING RESISTIVE ELEMENT COUPLED TO REFERENCE CELL FOR IMPROVED RELIABILITY

(75) Inventors: Richard M. Fastow, Cupertino, CA (US); Wing Han Leung, Sunnyvale, CA (US); John Wang, San Jose, CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 17 days.

(21) Appl. No.: 10/285,909

(22) Filed: Oct. 31, 2002

(51) Int. Cl.[7] .............................................. G11C 7/02
(52) U.S. Cl. ............... 365/210; 365/185.2; 365/185.26; 365/185.29; 365/226
(58) Field of Search ........................... 365/210, 185.2, 365/185.26, 185.29, 226, 189.09

(56) References Cited

U.S. PATENT DOCUMENTS 5,537,358 A * 7/1996 Fong ........................... 365/218
5,898,617 A * 4/1999 Bushey et al. ............ 365/185.2
2003/0043621 A1 * 3/2003 Wong ..................... 365/185.03

* cited by examiner

Primary Examiner—Richard Elms
Assistant Examiner—Pho M. Luu
(74) Attorney, Agent, or Firm—Wagner, Murabito & Hao LLP

(57) ABSTRACT

A reference cell transistor with a series resistance to improve reliability in reading cells in an associated memory array. The reference cell transistor is coupled in series with a resistive element such that a reference current flows therethrough to reduce a voltage between a gate and a source of the reference cell transistor. This bends the $I_{ds}$ versus $V_{gate}$ curve of the reference cell downward and compensates for irregularities in the resistance seen in series with the memory cell transistors. In this fashion, the margin when reading memory cells is improved and the reference current is more reliable. The resistive element may be external to a region having the reference cell transistor. Alternatively, the resistive element may be internal to a region with the memory array and reference cell. For example, it may be formed by extending the source region of the reference cell transistor.

19 Claims, 11 Drawing Sheets

MEMORY DEVICE HAVING RESISTIVE ELEMENT COUPLED TO REFERENCE CELL FOR IMPROVED RELIABILITY

TECHNICAL FIELD

The present invention generally pertains to the field of memory arrays. More particularly, embodiments of the present invention are related to a memory array reference cell having an added series resistance to improve reliability in reading cells in the memory array.

BACKGROUND ART

Non-volatile, reprogrammable memory devices such as flash memory are highly desirable and have many applications from storing a computer system's BIOS to functioning as a memory for devices such as digital cameras. Typically, such memory devices may be reprogrammed hundreds of thousands of times and may be programmed or erased in blocks of, for example, hundreds or thousands of bits. Such devices may operate by storing a charge in a memory cell. For example, a typical flash memory cell may be programmed to hold a charge in a floating gate region of a transistor.

By storing a charge in the floating gate, the memory cell transistor's threshold voltage ($V_t$) is increased relative to the case when the gate holds no charge. This charge may be detected by applying voltages to the transistor and sensing a drain to source current. For example, a first voltage may be applied between the transistor's gate and source, while applying a second voltage between its drain and source. The applied gate to source voltage is between the programmed $V_t$ and the erased $V_t$. In this fashion, if the transistor produces a significant current ($I_{DS}$), it is assumed that the $V_t$ is low and the transistor is erased. If the transistor produces very little or no current, it is assumed that the $V_t$ is high and the transistor is programmed.

In order to determined if the current is 'high' or 'low', the current is typically compared to a reference current that is produced by a reference memory cell that has been fabricated to be nearly identical to the cells in the memory core. Thus, with the same applied voltages it should produce the same $1_{DS}$. FIG. 1 shows an $I_{DS}$ versus $V_{GS}$ graph 100 illustrating two curves, an erased curve 101 referring to a transistor with a low threshold voltage ($V_{ta}$) and a programmed curve 102 referring to a transistor with a high threshold voltage $V_{tp}$. If a read voltage ($V_{read}$) is applied between the respective transistor's gates and ground (along with a suitable drain to source voltage), then the drain to source current ($I_{read}$) may be found from the y-axis. If the transistor was programmed, $I_{read}$ is expected to be very low or zero. If the transistor was erased, $I_{read}$ is expected to be near the value seen on the y-axis.

However, the fabrication process cannot produce every transistor to be exactly the same. Therefore, the programmed and erased curves for each transistor will not be identical. Consequently, the margin between the two curves will not be as great as the ideal case shown in FIG. 1. It is desirable to keep the margins as high as possible for reliable reading of the memory cells.

As one example of the importance of keeping read margins high, consider multi-level flash. These technologies store one of several different amounts of charge in the floating gate to create one of several different $V_t$. The reliability of such multi-level flash is hard to achieve because the margin between one voltage threshold level and the next has to be small to establish multi-levels. To widen the voltage threshold window, multi-level flash may operate at higher voltages than other memories. However, higher operating voltages cause other problems, such as oxide breakdown. Thus, alternative means of increasing margins are sought for this and other floating gate memories.

Thus, a need has arisen for a high-density non-volatile memory array. A still further need exists for a high-density non-volatile memory array having high reliability. An even further need exists for a non-volatile memory array that may be fabricated with existing semiconductor processing techniques without considerable revamping of the fabrication process.

SUMMARY

Embodiments of the present invention provide a high-density non-volatile memory array. Embodiments of the present invention provide for a high-density non-volatile memory array having high reliability. Embodiments of the present invention provide for a non-volatile memory array that may be fabricated with existing semiconductor processing techniques without considerable revamping of the fabrication process.

A reference array having a reference cell with an added series resistance to improve reliability in reading cells in an associated memory array is disclosed. The reference array comprises a plurality of transistors, one of the transistors serving as a reference cell transistor. The plurality of transistors are fabricated with similar dimensions and characteristics as a transistors in the associated memory array. The reference cell transistor is for producing a reference current for reading memory cells in the associated memory array by comparing the reference current to a current produced by individual transistors of the memory cells. The reference cell transistor is coupled in series with a resistive element such that the reference current flows therethrough to reduce a voltage between a gate and a source of the reference cell. This bends the $I_{ds}$ versus $V_{gate}$ curve of the reference cell downward and compensates for irregularities in the resistance seen in series with the memory cell transistors. In this fashion, the margin when reading memory cells is improved and the reference current is more reliable.

The resistive element may be external to a region having the memory array and reference cell. For example, it may comprise a polysilicon region in area peripheral to the memory array. Alternatively, the resistive element may be internal to region with the memory array and reference cell. For example, it may be formed by extending the source region of the reference cell.

These and other advantages of the present invention will no doubt become obvious to those of ordinary skill in the art after having read the following detailed description of the preferred embodiments which are illustrated in the various drawing figures.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Embodiments of the present invention are related to a memory array reference cell having an added series resistance to improve reliability in reading cells in the memory array. The memory array may be a flash memory array, although the present invention is not so limited. In general, memory arrays having a memory cell that is readable by comparing its read current to that of a reference cell may be applicable to embodiments of the present invention. Embodiments of the present invention are well suited to a variety of memory cells, including but not limited to single-bit memory cells, double-bit memory cells, and multi-level memory cells.

Figure 2:
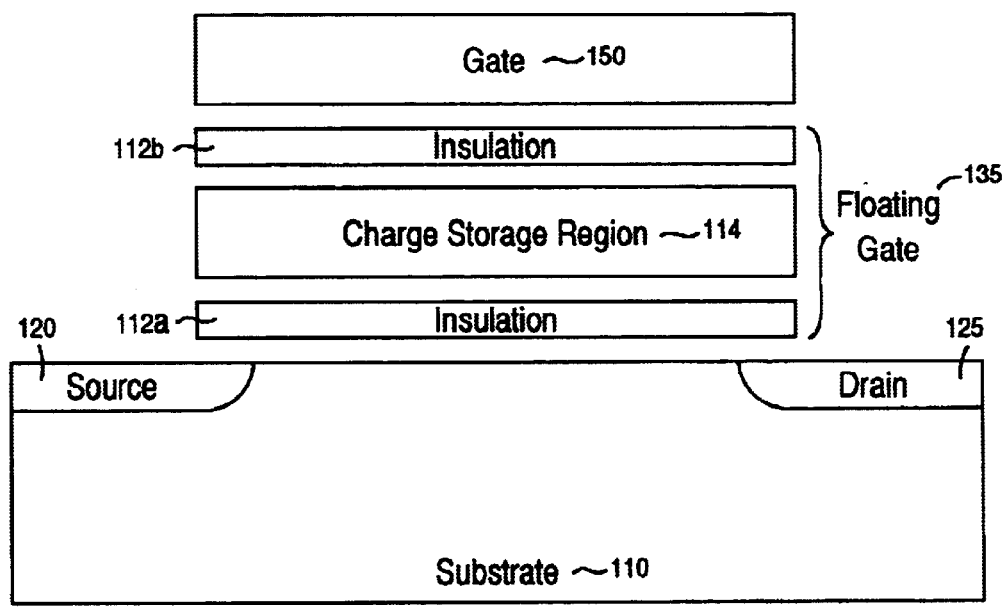
FIG. 2 illustrates a transistor functioning as a single memory cell that stores one bit of information and that may be read or used as a reference cell in embodiments of the present invention.

FIG. 2 illustrates an exemplary transistor functioning as a memory cell 200 that may store one bit of information. Embodiments of the present invention use such a memory cell 200 as a reference cell and in a memory array, although embodiments of the present invention are not limited to such a memory cell 200. Other embodiments of the present invention use a double-bit memory cell, such as the exemplary double-bit memory cell 1000 of FIG. 9. Double-bit memory cells 200 such as the MirrorBit™ technology, provided by Advanced Micro Devices of Sunnyvale, Calif. are capable of such operation. Other embodiments of the present invention may use multi-level cells.

The memory cell 200 of FIG. 2 comprises a substrate 110 and a source region 120 a drain region 125. Above the substrate 110 is a floating gate region 135 comprising a charge storage region 114 sandwiched between two insulating layers 112a, 112b. The charge storage region 314 may comprise polysilicon and the insulating layers may comprise silicon dioxide ($SiO_2$) and silicon nitride (SiN). Above the floating gate 135 is a gate 150 that may comprise polysilicon.

Figure 3A:
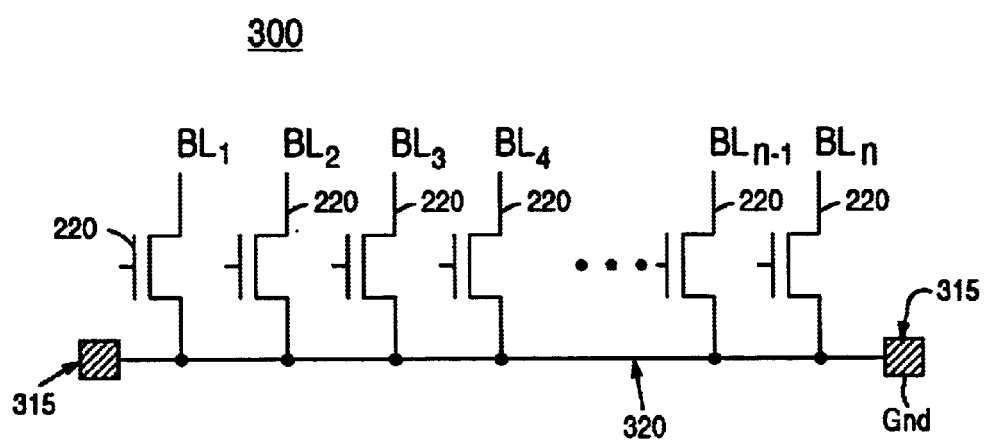
FIG. 3A is a diagram illustrating a portion of a memory array having transistors with various resistances to ground, which embodiments of the present invention reliably read.

FIG. 3A illustrates a portion of a memory array 300, which may form a portion of embodiments of the present invention. Each of the memory array transistors 220 may be coupled to ground. A ground line 320 may connect the sources of the memory array transistors 220 to ground points 315. However, in some embodiments the transistors are not always coupled to ground. For example, embodiments using a double-bit memory cell may have source/drain regions of which either may be coupled to ground, depending on which side of the memory cell is being accessed.

Still referring to FIG. 3, ground points 315 may be at a common potential. Because the length of the ground line 320 connecting a given memory array transistor 220 to a ground point 315 is longer for those in the middle of the memory array 300, those memory array transistors 220 have a higher series resistance to a ground point 315. When a given memory array transistor 220 is conducting, the series resistance will have a voltage across it, which will increase the transistor's source terminal to ground voltage by a corresponding amount. This will decrease the transistor's gate to source voltage ($V_{gs}$), which may result in a lower $I_{ds}$.

Figure 3B:
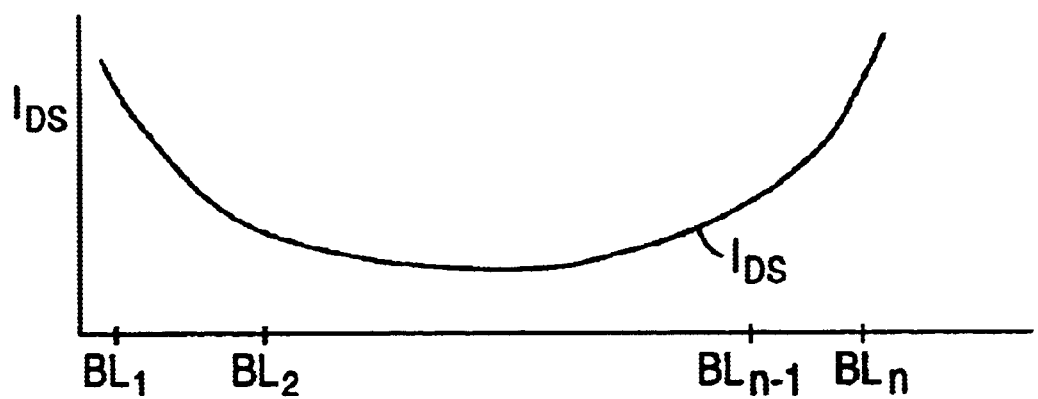
FIG. 3B is a graph of $I_{ds}$ versus bitline position of a transistor in a configuration as seen in FIG. 3A, which embodiments of the present invention reliably read.

The drop in $I_{ds}$ is illustrated in FIG. 3B, which shows a graph of $I_{ds}$ versus position of the memory array transistor 220 in the memory array 300. It is assumed that the memory array transistors 220 themselves have identical characteristics and that the same $V_{dd}$ is applied to their drains and the same voltage is applied to their gates ($V_{gate}$). The memory array transistors 220 that are closest to a ground point 315 have the highest $I_{ds}$. The drop in the $I_{ds}$ in the middle is due to the memory array transistors 220 that are farthest from a ground point 315 having the highest source to ground point 315 resistance.

Moreover, a given memory array transistor 220 or line of memory array transistors 220 may face an unusually high series resistance. For example, differences in the fabrication process may lead to such higher resistances. Thus, not all rows of transistors 220 in the memory array 300 will have the same $I_{ds}$ curve seen in FIG. 3B. For example, those with higher resistances to ground may have a lower $I_{ds}$. This lower $I_{ds}$, may make reading the charge in the memory array transistors 220 somewhat less reliable, as there is somewhat less margin for error when differentiating between a memory array transistor 220 that is programmed or erased.

Figure 4:
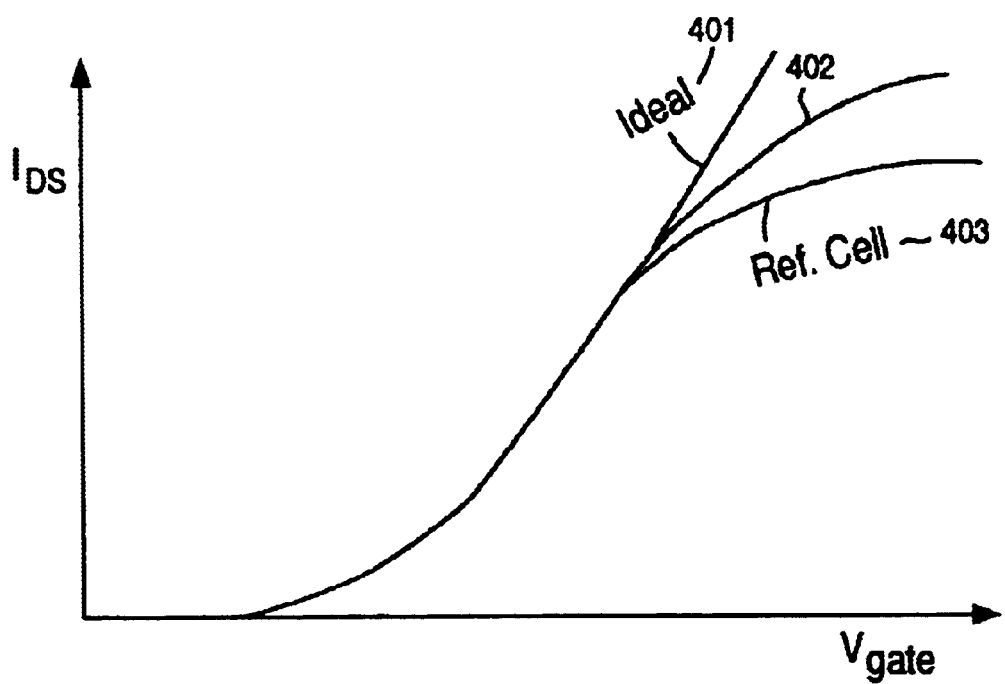
FIG. 4 is a graph of $I_{ds}$ versus $V_{gate}$ illustrating compensating for irregularities in resistance in a memory core, according to embodiments of the present invention.

FIG. 4 illustrates several curves of $I_{ds}$ versus $V_{gate}$. Note that $V_{gate}$ is not the gate to source voltage, but the gate to ground voltage. Ground in this case does not mean the point where the memory array transistor 220 connects to the ground line 320, but may mean a point at a common potential. The three curves may correspond to three identical transistors that have different series resistances between a transistor source terminal and a ground point 315.

The ideal curve 401 illustrates an ideal case, for example, no series resistance to reduce the actual gate to source voltage as discussed herein. The typical worst case 402 illustrates the case of the middle of the graph in FIG. 3B. In this case, the $I_{ds}$ curve in FIG. 4 may bend slightly downward due to the increasing effect the series resistance has as $I_{ds}$ increases. This corresponds to the memory array transistor 220 with the greatest distance, and hence greatest resistance to a ground point 315. However, as discussed above, the typical worst case is not the absolute worst case. For example, a memory array transistor 220 that sees an usually high resistance will have a curve that is even lower than the typical worst case 402 curve. The reference cell curve 403 illustrates an affect on the Id, curve achieved by embodiments of the present invention by coupling a series resistance to the reference cell. This added resistance adds to the reliability of reading a memory array.

Figure 1:
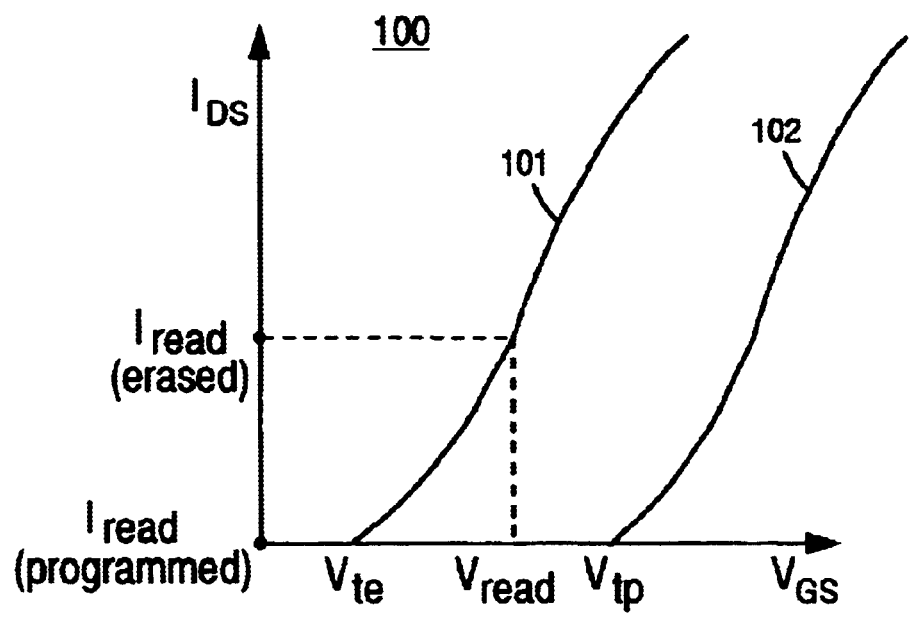
FIG. 1 is a graph illustrating typical curves of $I_{ds}$ versus $V_{gs}$ for transistors having various threshold voltages.

Referring again to FIG. 1, if a memory cell loses some of its charge in the floating gate, then the voltage threshold will be reduced. Thus, the programmed curve 102 in FIG. 1 will shift to the left. If the shift is great enough, then the transistor will conduct when a read voltage ($V_{read}$) is applied to the gate. Provided that the programmed curve 102 does not shift too far to the left, the read current ($1_{read}$) will be very small and will be easily distinguishable from the expected current ($I_{read}$) of the erased case. However, as discussed herein, the $I_{ds}$ curves will vary from transistor to transistor. If the $I_{read}$ of an erased transistor is unexpectedly low (e.g., due to unusually high series resistance), it should not be interpreted as a case of a programmed transistor that has lost charge and is hence conducting a small current. By causing the reference cell to have an $I_{ds}$ curve 403 as seen in FIG. 4, reading the memory array transistors 220 is more reliable.

Figure 5:
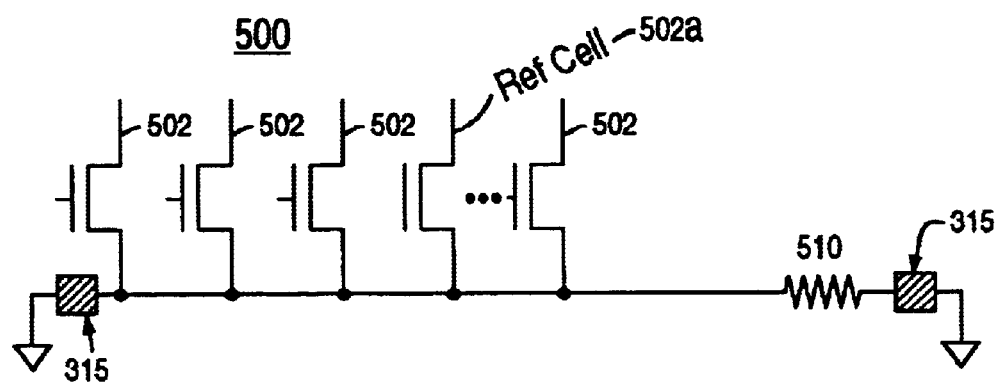
FIG. 5 illustrates a reference array having an external resistor, according to an embodiment of the present invention.

FIG. 5 illustrates one embodiment of the present invention to add a resistive element 510 coupled to a ground point 315 in series with a reference cell transistor 502a. A reference array 500 has a number of reference array transistors 502, with one used as a reference cell transistor 502a. Typically, the reference array transistors 502 are fabricated with approximately the same characteristics (dimension, doping, etc.) as the memory array transistors 220 (e.g., FIG. 3A). The reference cell transistor 502a produces a reference current that may be compared to the read current $I_{read}$ of a memory array transistor 220 to determine whether the memory array transistor 220 is programmed or erased. As discussed herein, adding the resistive element 510 improves the reading margin and thus makes reading the memory array transistors 220 more reliable.

Figure 6:
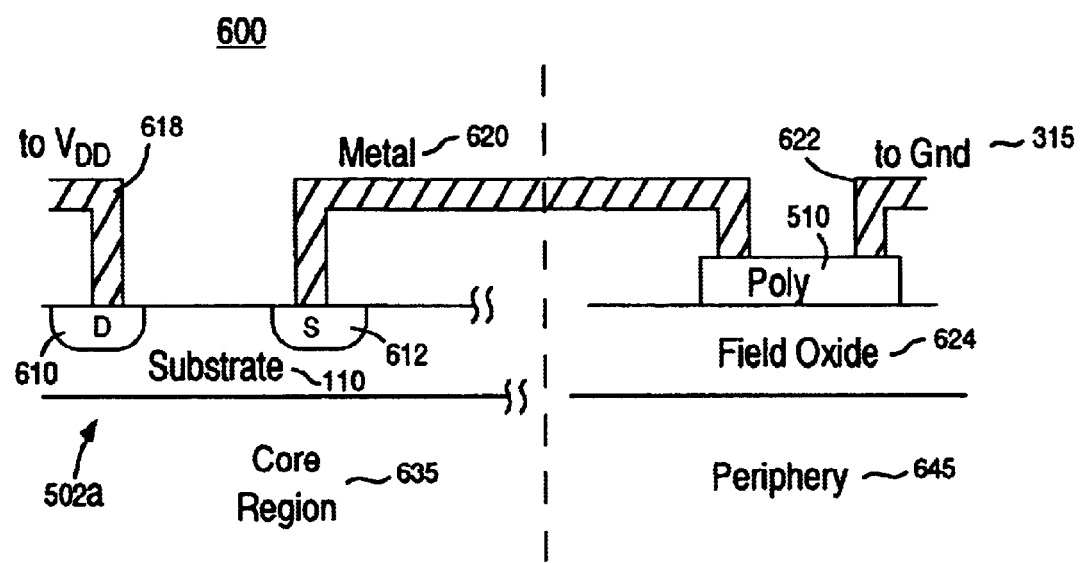
FIG. 6 is a side sectional view of a reference cell having an external resistor, according to an embodiment of the present invention.

FIG. 6 shows a side view of an embodiment of a portion of a memory device 600 in which a resistive element 510 is external to a region having the reference array (not shown). For example, the memory device 600 has an area labeled the core region 635, which may have a reference array (e.g., FIG. 5, 500) and a memory array (e.g., FIG. 3A, 300). The periphery region 645 may contain associated circuitry. In this embodiment, the resistive element 510 is in the peripheral region 645. A reference cell transistor 502a is shown in the core region 635. The reference cell transistor 502a has a drain 610, which may be operable to couple to a voltage source (e.g., $V_{dd}$) through a fist metal region 618. Although FIG. 6 may represent a floating gate case, embodiments of the present invention are not so limited. For example, a double-bit memory cell, as in FIG. 9 may be used in other embodiments of the present invention.

The reference cell transistor 502a also has a source terminal 612 that couples to the resistive element 510 through a second metal region 620. The resistive element 510 couples to ground 315 through metal region 622 and may be formed of polysilicon; however, the material is not critical. The resistance may be selected to create an $I_{ds}$ versus $V_{gate}$ curve with suitable characteristics to make reading the memory array 300 more reliable. Any suitable resistance value may be used. In one embodiment, the value is approximately 1000 Ohms, although the present invention is not so limited.

Figure 7:
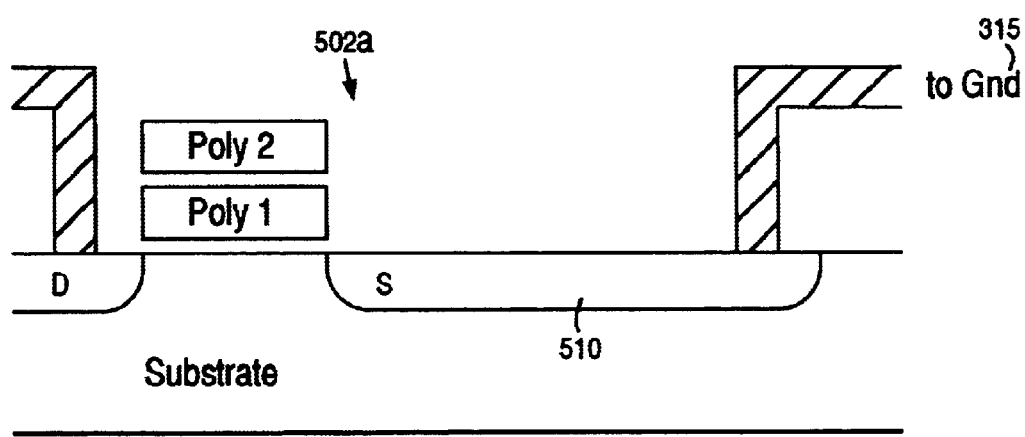
FIG. 7 is a side sectional view of a reference-cell having an internal resistor, according to an embodiment of the present invention.

FIG. 7 illustrates an embodiment in which the resistive element 510 is internal to the core region 635. In this case, the resistive element 510 may be formed by extending the reference cell transistor's 502 source region and coupling it to ground 315 with the contact to the source region being far away from the transistor's channel.

Figure 8:
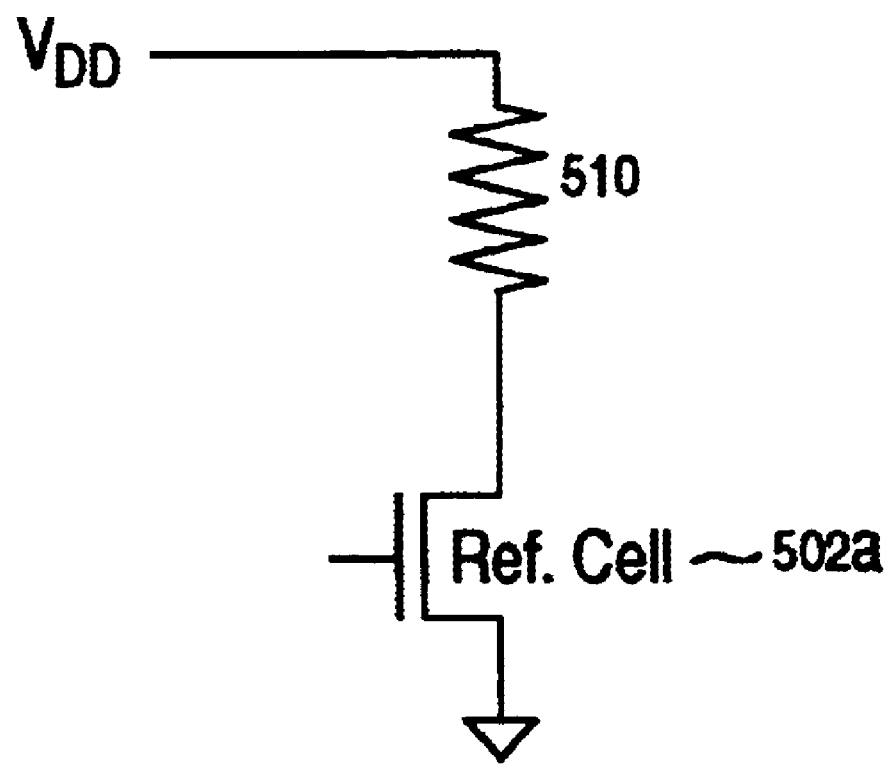
FIG. 8 is a diagram of a reference cell coupled to a compensation resistor at its drain, according to an embodiment of the present invention.

FIG. 8 illustrates an embodiment in which a resistive element 510 is coupled in series to a drain. The resistive element 510 is operable to couple to a voltage source. Thus, by series resistance it may be meant the resistance between a drain terminal and a voltage source or between a source terminal and ground 315, assuming typical operation of applying a voltage between a transistor's drain and source as part of the read operation.

In the embodiment of FIG. 8, the resistive element 510 may serve to lower the drain voltage and hence the drain to source voltage. Depending on the operating characteristics of the reference cell transistor 502a, this may also serve to reduce $I_{ds}$. However, the effect may not be as significant as an embodiment that lowers $V_{gs}$ as the reference cell transistor 502a may not be as sensitive to changes in $V_{ds}$ For example, if the reference cell transistor 502a is operating in the pinch-off region the effect may be small. However, below the pinch-off region the reference cell transistor's 502a $I_{ds}$ may be more dependent on $V_{ds}$.

Figure 9:
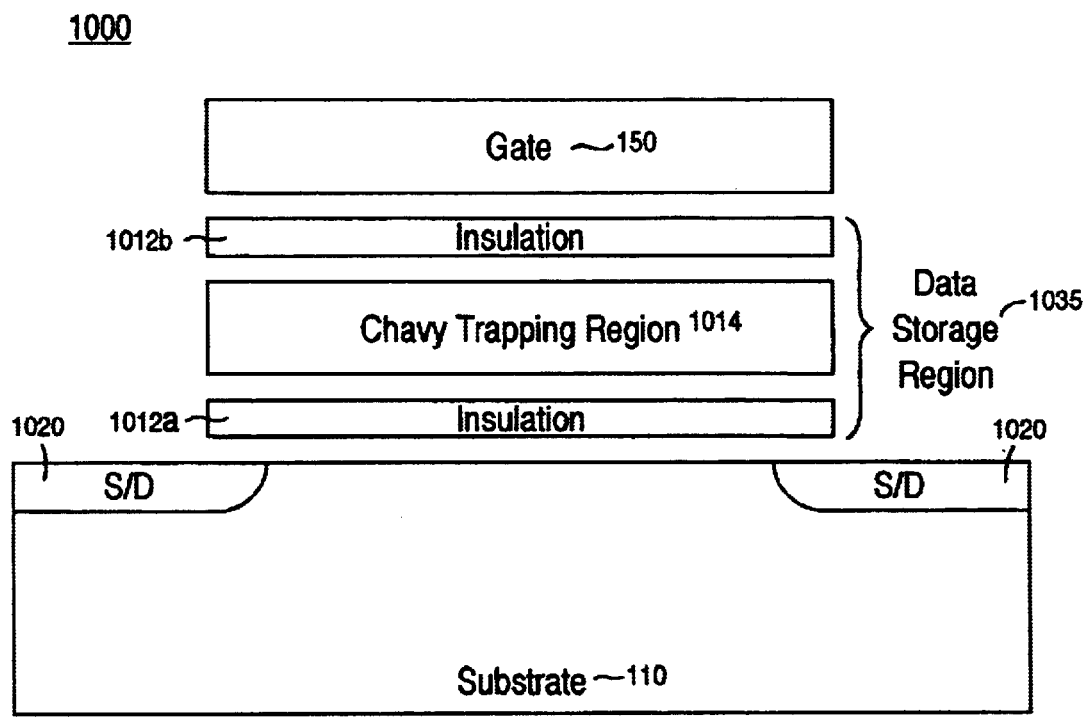
FIG. 9 is a diagram of an exemplary double-bit memory cell used in embodiments of the present invention.

It will further be understood that variations of embodiments of the present invention are possible for technologies, such as MirrorBit™for which one terminal of a double-bit memory cell 200 is not always coupled to ground 315. An exemplary double-bit memory cell 1000 is shown in FIG. 9. Such a memory cell 1000 may comprise a data storage region 1035 having a charge-trapping region 1014 between two insulating layers 1012a and 1012b. The exemplary double-bit memory cell 1000 has two drain/source regions 1020 that may be fabricated with similar characteristics.

Figure 10:
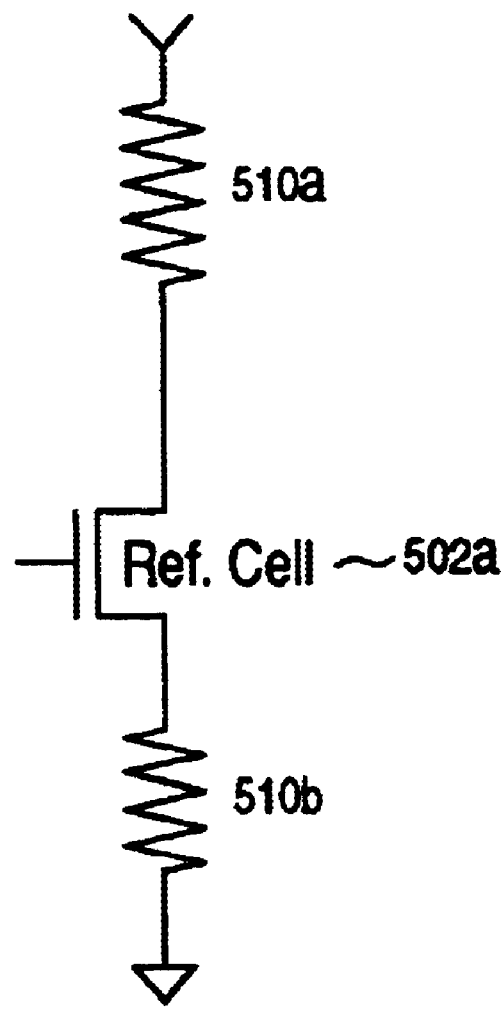
FIG. 10 is a diagram of a reference cell coupled to two compensation resistors, according to an embodiment of the present invention.

In such as case, a resistive element 510 may be coupled to both drain/source regions 1020 such that regardless of which side of the double-bit memory cell 1000 is being read the gate to source voltage will be reduced. Thus, a reference cell transistor 502 of this type may be read either way, if desired. Referring now to FIG. 10, a reference cell transistor 502 is shown with a first resistive element 510a coupled between one terminal and a voltage source, and a second resistive element 510b coupled between a second terminal and ground. The exemplary double-bit memory cell 1000 of FIG. 9 may be used for the reference cell transistor 502a in this embodiment.

Therefore, it will be seen that embodiments of the present invention provide a high-density non-volatile memory array. Embodiments of the present invention provide for a high-density non-volatile memory array having high reliability. Embodiments of the present invention provide for a non-volatile memory array that may be fabricated with existing semiconductor processing techniques without considerable revamping of the fabrication process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device comprising:
   a memory array comprising a plurality of transistors, wherein said memory array is in a core region;
   a resistive element, wherein said resistive element is formed external to said core region; and
   a reference cell for producing a reference current for reading said plurality of memory array transistors, said reference cell coupled in series to said resistive element to increase resistance from a voltage source through said reference cell to a ground, wherein said reference cell is in said core region.

2. A memory device as in claim 1, wherein said resistive element comprising polysilicon.

3. A memory device comprising:
   a memory array comprising a plurality of transistors;
   a resistive element comprising polysilicon; and
   a reference cell for producing a reference current for reading said plurality of memory array transistors, said reference cell coupled in series to said resistive element to increase resistance from a voltage source through said reference cell to a ground.

4. A memory device comprising:
   a memory array comprising a plurality of transistors;
   a resistive element; and
   a reference cell for producing a reference current for reading said plurality of memory array transistors, said reference cell coupled in series to said resistive element to increase resistance from a voltage source through said reference cell to a ground, said reference cell comprising a source terminal coupled to said resistive element by a metal region.

5. A memory device comprising:
   a memory array in a core region and comprising a plurality of transistors;
   a resistive element formed internal to said core region; and
   a reference cell in said core region and for producing a reference current for reading said plurality of memory array transistors, said reference cell coupled in series to said resistive element to increase resistance from a voltage source through said reference cell to a ground.

6. A memory device as in claim 5, wherein said resistive element comprises an extended source region of said reference cell.

7. A memory device as in claim 5, wherein said resistive element is coupled to a drain of said reference cell and is operable to couple to a voltage source.

8. A memory device comprising:
   a memory array comprising a plurality of transistors;
   a reference cell for producing a reference current for reading said plurality of memory array transistors; and
   a resistive element configured to reduce said reference current by an amount to compensate for lower than normal currents through ones of said plurality of memory array transistors due to higher than normal resistances in series with said ones of said plurality of memory array transistors, wherein said resistive element is coupled in series to said reference cell to increase resistance from a voltage source through said reference cell to a ground.

9. A memory device comprising:
   a plurality of transistors, one of said transistors serving as a reference cell transistor, said plurality of transistors fabricated with similar dimensions as storage transistors in a memory core;
   said reference cell transistor operable to store a charge and having a drain and a source;
   said reference cell transistor for producing a reference current for reading said storage transistors by comparing said reference current to a current produced by ones of said storage transistors;
   a resistive element coupled to ground; and
   said reference cell transistor having said source coupled to said resistive element such that said reference current flows therethrough to reduce a voltage between said gate and said source ($V_{gs}$)wherein a curve of said reference current versus $V_{gate}$ of said reference cell transistor is modified to compensate for irregularities in resistance seen in series with ones of said storage transistors.

10. A memory device as in claim 9, further comprising a peripheral region, wherein said resistive element is formed in said peripheral region.

11. A memory device as in claim 10, wherein said resistive element comprises polysilicon.

12. A memory device as in claim 9, wherein said resistive element is coupled to said source of said reference cell transistor by a metal region.

13. A memory device as in claim 9, wherein said resistive element and said reference cell transistor are formed internal to said memory core.

14. A memory device as in claim 9, wherein said resistive element is configured to compensate for higher than normal resistances in series with said storage transistors.

15. A memory device comprising:
   a flash memory array comprising a plurality of transistors, wherein each of said plurality of transistors comprises a terminal operable to be coupled to ground, wherein each of said transistors has an $I_{ds}$ versus $V_{gate}$ curve that is a function of resistance coupled between said transistor to ground;
   a first resistive element; and
   a reference array fabricated having transistors with approximately the same dimensions as said plurality of memory array transistors, said reference array having a reference cell that produces a reference current for reading said memory array transistors;
   wherein said reference cell is operable to have a first terminal coupled to ground via said first resistive element to increase resistance between said reference cell and said ground to compensate for possible larger than normal resistances between sources of said memory array transistors and ground.

16. A memory device according to claim 15, further comprising:
   a second resistive element coupled to a second terminal of said reference cell, wherein said reference cell is operable to have said second terminal coupled to ground via said second resistive element to increase resistance between said second terminal of said reference cell and said ground.

17. A memory device as in claim 15, wherein said first resistive element is approximately 1000 Ohms.

18. A memory device as in claim 15, wherein said first resistive element is configured to reduce said reference current to compensate for lower than normal currents through ones of said plurality of memory array transistors due to higher than normal resistances in series with said ones of said plurality of memory array transistors.

19. A memory device as in claim 15, further comprising a peripheral region external to a region comprising said flash memory array and said reference array, wherein said first resistive element is formed in said peripheral region.

* * * * *